United States Patent [19]
Loo

[11] Patent Number: 5,784,780
[45] Date of Patent: Jul. 28, 1998

[54] METHOD OF MOUNTING A FLIP-CHIP

[75] Inventor: Mike C. Loo, San Jose, Calif.

[73] Assignee: LSI Logic Corporation, Milpitas, Calif.

[21] Appl. No.: 778,909

[22] Filed: Jan. 3, 1997

Related U.S. Application Data

[62] Division of Ser. No. 538,631, Oct. 4, 1995, Pat. No. 5,637, 920.

[51] Int. Cl.$^6$ ............................................. H05K 3/34
[52] U.S. Cl. .............................. 29/840; 29/832; 257/668; 257/698
[58] Field of Search ........................... 29/827, 832, 890; 287/668, 698

[56] References Cited

U.S. PATENT DOCUMENTS

| | | | |
|---|---|---|---|
| 3,705,332 | 12/1972 | Parks | 317/101 |
| 4,667,401 | 5/1987 | Clements et al. | 29/832 |
| 4,942,140 | 7/1990 | Ootsuki et al. | 29/827 |
| 4,970,780 | 11/1990 | Suda et al. | 29/840 |
| 5,065,227 | 11/1991 | Frankeny et al. | |
| 5,084,961 | 2/1992 | Yoshikawa | 29/832 X |
| 5,157,477 | 10/1992 | Chance | |
| 5,203,076 | 4/1993 | Banerji et al. | 29/840 |
| 5,292,688 | 3/1994 | Hsiao et al. | 29/840 |
| 5,381,039 | 1/1995 | Morrison | 257/701 |
| 5,386,624 | 2/1995 | George et al. | |
| 5,434,452 | 7/1995 | Higgins, III | 257/773 |
| 5,521,435 | 5/1996 | Mizukoshi | |

FOREIGN PATENT DOCUMENTS 6-61383  3/1994  Japan ................. 257/778

*Primary Examiner*—Carl J. Arbes
*Attorney, Agent, or Firm*—Luedeka, Neely & Graham, P.C.

[57] ABSTRACT

A package for mounting a semiconductor device to a circuit board. An insulating substrate is provided, which has at least one layer, and provides rigidity to the package. A plurality of electrically conductive contacts are disposed on the top surface of the substrate, receive the semiconductor device, and make electrical contact between the semiconductor device and the substrate. A plurality of electrically conductive through-holes are formed in the substrate, and extend from the top surface of the substrate to the bottom surface of the substrate. The through-holes make electrical connection between all of the layers of the substrate. Electrical interconnections between the contacts and the through-holes are provided by a plurality of electrically conductive traces. A z-conductive layer is attached to the bottom surface of the substrate. Electrical continuity between the bottom surface of the z-conductive layer and the through-holes extending to the bottom surface of the substrate is substantially limited to the z axis of the z-conductive layer according to a predetermined pitch. A plurality of electrically conductive connectors are attached to the bottom surface of the z-conductive layer, and are disposed so as to be in electrical contact through the z-conductive layer with no more than one through-hole.

2 Claims, 4 Drawing Sheets

METHOD OF MOUNTING A FLIP-CHIP

This application is a divisional of application Ser. No. 08/538.631, filed Oct. 4, 1995 now Pat. No. 5,637,920 issued Jun. 10, 1997.

FIELD OF THE INVENTION

The present invention relates to the field of semiconductor device packaging. More particularly, the invention relates to surface mount packaging for flip-chip semiconductor devices.

BACKGROUND OF THE INVENTION

With their versatility and compact nature, semiconductor devices are now used in virtually all electronic equipment. Due to their complex structure and small size, semiconductor devices may be extremely fragile. The devices are, therefore, typically packaged to protect them from abrasion or shock which could easily destroy them. Along with protecting the device itself, semiconductor packaging should also be as compact as practical, while facilitating electrical contact to the device within the package. This enables electrical components containing semiconductors to be commensurately smaller.

Surface mount technology is often employed to keep the package for an integrated circuit as compact as possible. Surface mount technology reduces the size of a package by eliminating certain parts, such as sockets, which are unnecessary for the semiconductor's operation. One type of surface mount package is the ball grid array package. A ball grid array package not only provides a substrate on which the semiconductor device is mounted, but also the electrical contact between the bonding pads of the semiconductor device and a circuit board. The ball grid array package mounts onto a circuit board.

In a ball grid array package, the bottom surface of the semiconductor device is attached to the top surface of the package substrate. Electrical connections are made between the bonding pads on the top surface of the device and contacts on the substrate. After these electrical connections are made, the semiconductor device is encapsulated in some manner to protect it. Depending on the specific semiconductor device or the environment for its use, the device may be encapsulated using, for example, epoxy or a hermetic seal.

The ball grid array package is named for the solder balls on the bottom surface of the substrate, opposite the semiconductor device. Disposed in a grid array, the solder balls are used to make contact with the circuit board. Inside the package are conductive traces which electrically connect the solder balls to the contacts on the top surface of the package substrate where the semiconductor device is attached. After placing the package with its solder balls over the contact areas of a circuit board, the package is attached to the circuit board by heating and melting the solder balls.

Bonding thin gold or gold alloy wire from the semiconductor's bonding pads to a corresponding contact on the ball grid array package substrate provides electrical connections between the semiconductor device. This conventional wire bonding process has several shortcomings. First, the wire bonding can cause excessive inductance to the electrical signal. Second, wire bonding requires bonding pads at the periphery of the semiconductor device. This can limit the amount of bonding pads on the die, which corresponds to the number of input and output signals available. Third, with peripheral bonding pads, power cannot be directly supplied to the interior of the semiconductor device.

Another method of making electrical connection between a semiconductor device and a semiconductor package does not require any bonding wires. This method employs a specifically designed integrated circuit known as a flip-chip. Flip-chips do not require bonding wires to form electrical connections. A flip-chip has bonding pads spaced around the entire top surface of the semiconductor device, rather than predominantly at the chip's periphery, as is common with a more traditional device requiring wire bonding. On each bonding pad of the flip-chip is placed a small solder bump. Instead of mounting the back of the flip-chip to the substrate, the flip-chip is flipped over so that the solder bumps make direct contact with appropriately arranged contacts on the package substrate.

By eliminating bonding wires, a package designed for a flip-chip greatly reduces inductance between the semiconductor device and the substrate, and allows the electrical signal to be supplied directly between the bonding pads on the semiconductor device and the contacts and traces on the substrate. Additionally, since flip-chips have bonding pads spaced across the entire top surface of the semiconductor device, rather than predominantly at the periphery of the device, a flip-chip can have far more bonding pads than a wire bonded chip. Also, with the bonding pads located across the interior of the flip-chip, power can be supplied directly to any location on the device.

Package substrates are usually made of a multi-layered material, such as printed circuit board, or flex circuit. A substrate may contain a portion of the required traces on each of several layers of the substrate. Conductive throughholes form the electrical connections between the traces on the different layers of the substrate. Because many electrical connections need to be made on the substrate directly under the flip-chip, that area contains many through-holes with a very fine pitch between them. With current technology, a through-hole required between any two layers of the substrate must be formed in the same position in all of the layers. That is, the through-hole forms a conductive path from the top surface of the multi-layered substrate, where the flip-chip is attached, to the bottom surface of the substrate.

To form a ball grid array package, the solder balls are attached to the bottom surface of the package substrate and connect with the appropriate through-holes. Unfortunately, the through-holes required to make electrical connection to a flip-chip will typically have a diameter and a pitch that is far smaller than the diameter of the conductive pads on which the solder balls are formed. A single solder ball conductive pad could, therefore, contact multiple throughholes creating unintended, and undesired, shorts and loops in the resulting circuit.

To circumvent this problem, traditional technology places all of the solder balls in an area of the package substrate outside the area occupied by the flip-chip. Thus the solder balls reside in an area of the package substrate having only the necessary through-holes to contact the solder balls and not in the area under the flip-chip which is densely populated with through-holes. Unfortunately, this technique tends to increase the package size, moving all of the solder balls to the periphery of the package and not utilizing the center of the package where the flip-chip is attached.

A need exists, therefore, for a ball grid array package that can be efficiently used with a flip-chip. The ball grid array package should permit solder ball placement in the area of the substrate underlying the flip-chip. Advantageously, such an array may be smaller than conventional packages while having surface area sufficient for the number of solder balls required to make electrical contact between the semiconductor device and the package.

SUMMARY OF THE INVENTION

These and other needs are met by a package for mounting a semiconductor device to a circuit board according to the present invention. The package provides an insulating substrate having a substantially flat top surface and a substantially flat opposing bottom surface. The substrate has at least one rigid layer.

A plurality of electrically conductive contacts are disposed on the top surface of the substrate. These contacts receive the semiconductor device making electrical contact between the semiconductor device and the substrate. The substrate contains a plurality of electrically conductive through-holes formed in the substrate and extending from its top surface to its bottom surface. The through-holes make electrical connection between all of the substrate layers, if the substrate comprises more than one layer. A plurality of electrically conductive traces provide electrical interconnections between the contacts and the through-holes.

A z-conductive layer is attached to the substrate. The z-conductive layer has a substantially flat top surface and an opposing substantially flat bottom surface. The top surface of the z-conductive layer is adjacent to and planar with the bottom surface of the substrate. Electrical continuity between the bottom surface of the z-conductive layer and the through-holes extending to the bottom surface of the substrate is substantially limited to the z axis of the z-conductive layer according to a predetermined pitch. Electrical conductivity in an x or y axis of the z-conductive layer is limited by the predetermined pitch.

A plurality of electrically conductive connectors are attached to the bottom surface of the z-conductive layer. The connectors are disposed so as to be in electrical contact through the z-conductive layer with no more than one through-hole. The connectors make electrical contact between a circuit board and the z-conductive layer.

Because the pitch of the z-conductive layer limits electrical conductivity along the x and y axes, the connectors may be placed in those portions of the z-conductive material underlying the through-holes and the semiconductor device, which may be a flip-chip. Advantageously, the predetermined pitch of the z-conductive layer allows a relatively large diameter connector, such as a solder ball, to be place in an area where several smaller diameter, fine pitch through-holes are located. Accordingly, an electrical connection to any given connector may be made with a single through-hole. Thus a flip-chip, which requires a number of fine pitch through-holes in the substrate directly under it may be used in a ball grid array package. Solder balls may also be placed in the area underlying the flip-chip. This reduces the size of the package, particularly when compared to traditional technology as discussed above.

In a preferred embodiment the flip-chip is under filled between the semiconductor device and the top surface of the substrate. This holds the semiconductor device securely to the substrate, and eliminates air pockets between the semiconductor device and the top surface of the substrate. Also, the pitch of the z-conductive layer varies across the surfaces of the z-conductive layer.

BRIEF DESCRIPTION OF THE DRAWINGS

Further advantages of the invention will become apparent from the detailed description of preferred embodiments below, particularly when considered in conjunction with the accompanying figures, none of which are necessarily to scale. The reference numerals in the figures denote like elements throughout the several views. The figures may be briefly described as follows.

DETAILED DESCRIPTION OF THE INVENTION

Figure 1A:
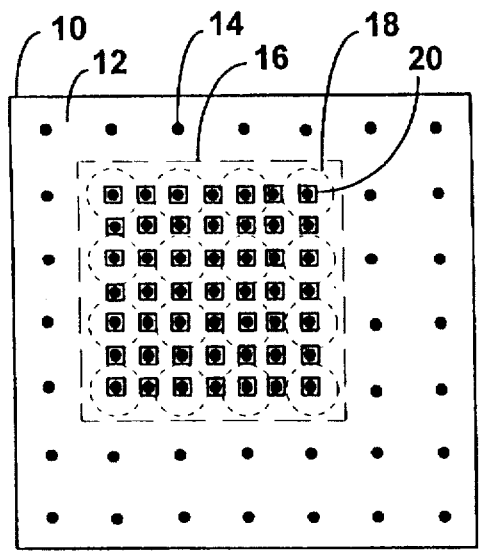
FIG. 1A is a plan view of a substrate, showing the first layer.

Referring now to the drawings, there is shown in FIG. 1A a plan view of a substrate 10. The substrate 10 is preferably comprised of one or more layers of an electrically insulating material, such as circuit board, or flex circuit, the first layer 12 of which is visible in FIG. 1A. Disposed about the surface of the substrate 10 are a plurality of electrically conductive through-holes 14, which provide for electrical contact between the several layers of the substrate 10. The through-holes 14 are more densely spaced in the region 16, which defines the area which would underlie a semiconductor device, not depicted in this figure, when mounted to the substrate 10. The through-holes 14 in the region 16 are connected to contacts 20, which will receive and make electrical contact to the semiconductor device.

The purpose of the substrate 10 is to serve as part of a package which will protect the semiconductor device, and to provide electrical contact between the semiconductor device and the circuit board on which the device is to be used. The techniques used to manufacture the semiconductor device allow for the fabrication of electrical contact points, or bonding pads. A bonding pad has a very small surface area. In general, bonding pads are spaced relatively close together as compared to features on a circuit board. The circuit board is fashioned using techniques which result in connections and electrical traces which are much larger in size than the semiconductor's bonding pads. Thus the substrate 10 provides an appropriate interface for making electrical connection between the small contacts on the semiconductor device and the larger contacts on the circuit board.

In forming this interface, the substrate 10 must electrically connect the bonding pads of a semiconductor device on one surface of the substrate 10, and provide electrical continuity between these contacts and other connectors on the opposing surface of the substrate 10. The connectors will be placed against the circuit board. However, because of the density of the connections between a semiconductor device and the substrate 10 within region 16, and manufacturing limitations for substrate 10 itself, all of the electrical traces needed for electrical continuity, as discussed above, will not generally fit on a single surface of the substrate 10. Therefore, substrate 10 may be comprised of multiple layers, like the first layer 12. The multiple layers provide the additional surfaces required for the electrical traces.

Figure 1B:
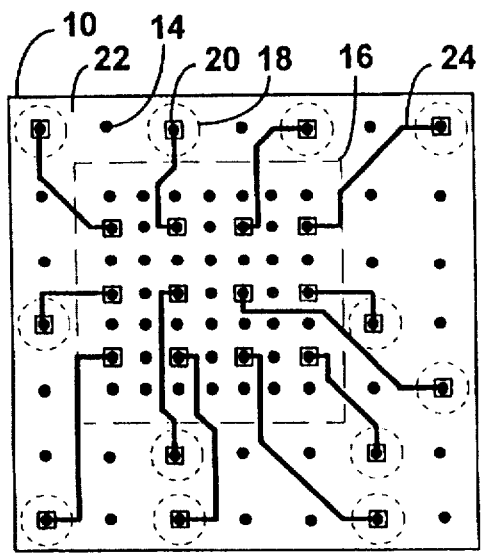
FIG. 1B is a plan view of the second layer of the substrate.

A second layer 22 is depicted in FIG. 1B, which shows traces 24 making electrical connection between different sets of contacts 20 and through-holes 14. FIG. 1B also shows the outlines of connectors 18 located on the bottom surface of the substrate 10. FIG. 1B somewhat depicts, although not to scale, the relative sizes of the contacts 20 on the top surfaces of the substrate 10 and the connectors 18, as well as the diameter and pitch of the through-holes 14. Only those connectors 18 which are electrically connected to contacts 20 on the second layer 22 of the substrate 10 are depicted in FIG. 1B. Similarly, FIG. 1B depicts those connectors 18 which are connected to contacts 20 on the first layer 12 of the substrate 10.

In the embodiment depicted in FIG. 1A, no traces are needed on the first layer 12 of the substrate 10. The connectors 18 are connected directly to the contacts 20 by through-holes 14. This ability to place connectors 18 within region 16 allows a package according to the present invention to be smaller than prior semiconductor packages. This is discussed in more detail below.

Figure 1C:
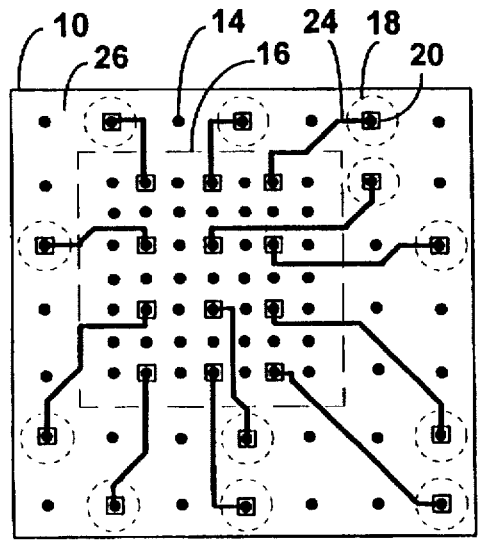
FIG. 1C is a plan view of the third layer of the substrate.
Figure 1D:
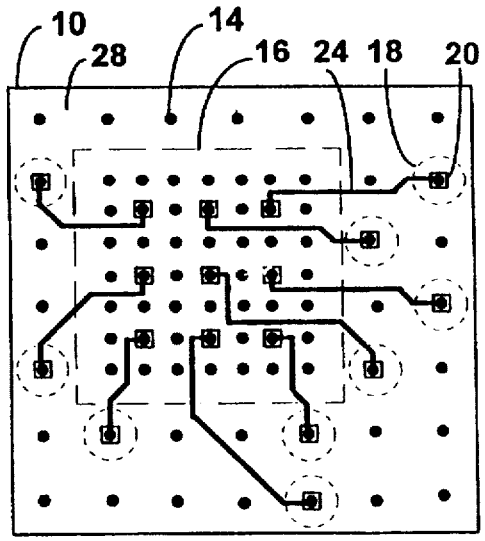
FIG. 1D is a plan view of the fourth layer of the substrate.

A third layer 26 and fourth layer 28 are depicted in Figs. 1C and 1D respectively. In the embodiment depicted in FIGS. 1A–1D, four layers are used. However, it will be appreciated that in actual practice, any number of layers as is required or is convenient, may be used to create the substrate 10. Similarly, while forty-nine connections are depicted as required to make electrical contact with the semiconductor device, this number is representative only. Devices requiring fewer or more contacts may just as easily be packaged using a package according to the present invention. Finally, the paths taken by the traces 24 are likewise arbitrary in their depiction. The traces may be regrouped and follow other paths according to goals and constraints not considered herein, or material to the present invention.

According to one embodiment of the present invention, however, each contact 20 on the layer 12 electrically connects to a connector 18 on the bottom surface of the layer 28 of the substrate 10. Thus, FIG. 1A depicts, for illustration purposes only, a first sixteen connections made directly via through-holes 14. The next twelve connections are depicted on the second layer 22, where traces 24 are employed between through-holes 14. Twelve more connections are shown on the third layer 26, which also uses traces 24, and the last nine connections of the forty-nine total illustrative connections are made on the fourth layer 28, which also uses traces 24.

Figure 2:
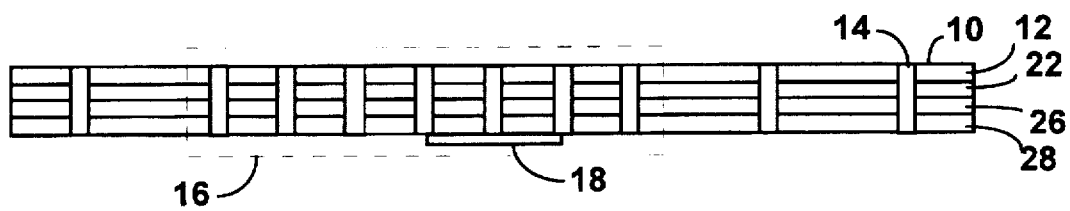
FIG. 2 is a cross-sectional view of the substrate.

In FIG. 2 there is depicted the substrate 10 in cross-section. The different layers 12, 22, 26, and 28 are shown, as are the conductive through-holes 14. Not depicted, for sake of clarity, are the traces 24 which interconnect the through-holes 14, or the contacts 20 located at each end of each of the traces 24, on the first layer 12, and on the bottom surface of the fourth layer 28.

As shown, the through-holes 14 are generally closer together, or in other words have a finer pitch, within the region 16, than do the through-holes 14 located outside of the region 16. Again, this finer pitch matches the fine pitch of the bonding pads on the flip-chip which may be located in region 16. When in place, the flip-chip bonding pads make electrical contact with the contacts 20, not depicted, located at the ends of the through-holes 14 on the top surface of the substrate 10.

Disposed on the bottom surface of the substrate 10 is a connector 18. Connector 18 is depicted in this figure to show, in cross-section, the relative sizes of the diameter of connector 18 and the pitch between the through-holes 14 within the region 16. As illustrated in FIG. 2, connector 18 may be large enough to make electrical contact with three of the through-holes 14 in the axis depicted in this cross-section. It will be appreciated that this illustration of relative size is exemplary only. In different embodiments, connector 18 may be of sufficient size to contact fewer or more than three of the through-holes 14. This depends on the diameter of connector 18 and the pitch of the through-holes 14.

In general, connector 18 cannot be made appreciably smaller, so as to contact just a single through-hole 14. The connector needs to have sufficient size to provide a robust connection to the circuit board to which it will eventually be bonded. The pitch of the through-holes 14 within region 16 is likewise dictated by external constraints, and cannot be appreciably altered. The proper position of through-holes 14 is dictated by the spacing of the semiconductor device's bonding pads which will be attached to the top surface of the substrate 10. However, it is generally unacceptable for a connector 18 to make electrical connection to more than one through-hole 14. This may create electrical loops and shorts in the resulting circuit. As discussed before, these and other constraints have traditionally made flip-chip technology incompatible with ball grid array packaging because connectors 18 could not be placed within region 16.

Figure 3:
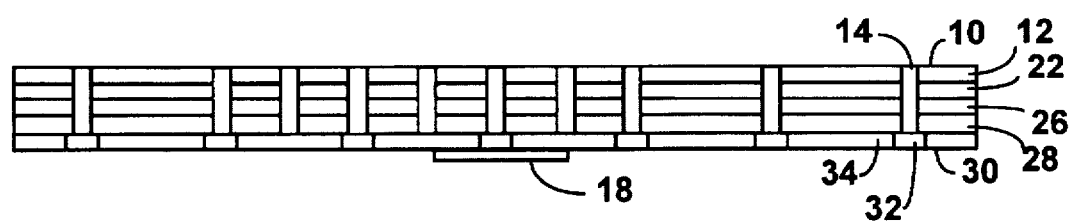
FIG. 3 is a cross-sectional view of the substrate with a z-conductive layer.

Referring now to FIG. 3, there is depicted the substrate 10 of FIG. 2 with a z-conductive layer 30 attached to the bottom surface of the fourth layer 28 of the substrate 10. The z-conductive layer 30 has conductive portions 32 disposed within non-conductive portions 34. As can be seen, the conductive portions 32 limit electrical conductivity within the z-conductive layer 30 to essentially the z axis. Thus electrical continuity is provided between the bottom surface and the top surface of the z-conductive layer 30 in those areas having a conductive portion 32. Conductivity is not facilitated in the x or y direction between different conductive portions 32 through the non-conductive portions 34.

The z-conductive layer 30 may be fashioned by any one of a number of different methods. For example, a single layer of flex circuit, circuit board, or other non-conductive material, may be used as the basis for the layer 30 and comprise the non-conductive portions 34. The conductive portions 32 may be formed by doping or impregnating the flex circuit with a conductive material or compound. Alternately, the conductive portions 32 may be formed by inserting metallic contacts between the non-conductive portions 34 where conductivity through the z-conductive layer 30 is desired.

In further alternate embodiments the z-conductive layer 30 may be formed by creating a layer of a non-conductive material, such as polyimide, which is used to provide the non-conductive portions 34 of the z-conductive layer 30. Within the polyimide, regions are formed for a conductive material. The z-conductive layer 30 may be formed either prior to being attached to the substrate 10, or in-situ with the substrate 10.

For example, in a preferred embodiment, a polyimide layer is applied to the substrate 10. The layer may be applied by roll coating, spraying, spinning, or other such technique. The polyimide layer may then be patterned in a photolithographic manner, by either applying a photoresist to the surface thereof, or by using a photosensitive polyimide. Etching the patterned polyimide leaves voids in locations where conductive portions 32 are required. These voids may then be filled with the conductive material. Following a final cure or bake, the z-conductive layer 30 comprises the non-conductive portions 34 of polyimide, and conductive portions 32 of the metal filled adhesive.

The conductive portions 32 are formed across the surface of the z-conductive layer 30 according to a predetermined pitch. The specific characteristics of the predetermined pitch are chosen according to the diameter and pitch of the through-holes 14 and the diameter and pitch of the connectors 18. The predetermined pitch is preferably selected such that each connector 18 contacts no more than one of the doped conductive portions 32.

In some embodiments the predetermined pitch is constant across the entire surface of the z-conductive layer 30. In other embodiments the predetermined pitch may vary across the surface of the z-conductive layer 30. For example, the pitch between conductive portions 32 may need to be different in the region 16 which underlies the semiconductor device, because of the finer pitch of through-holes 14 in this region 16. It may be necessary, for example, to have a larger pitch so that a single connector 18 does not make contact with more than one through-hole 14 through more than one conductive portion 32.

As depicted in FIG. 3, connectors 18 will eventually be formed on the bottom surface of z-conductive layer 30, rather than directly on the bottom surface of the substrate 10. As can be seen, neither the pitch of the through-holes 14 nor the diameter of the connector 18 has been altered. But, with the addition of the z-conductive layer 30, the electrical connections between the two features are restricted to sets of a single connector 18 in contact with a single through-hole 14.

Figure 4:
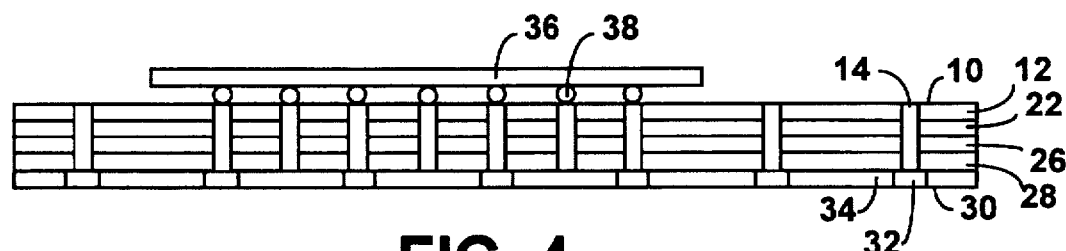
FIG. 4 is a cross-sectional view of the substrate with a flip-chip attached.
Figure 5:
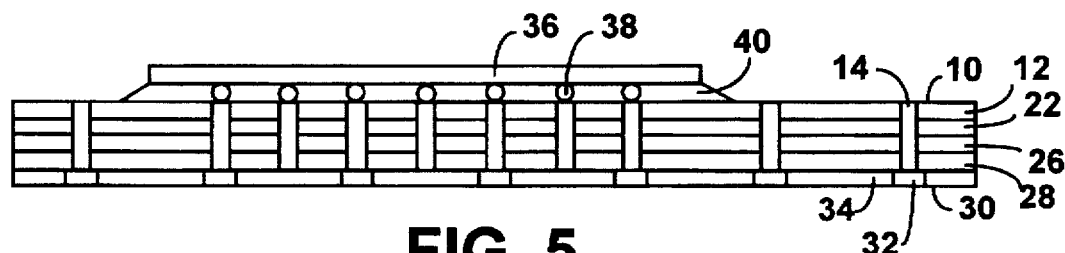
FIG. 5 is a cross-sectional view of the substrate and the flip-chip where the flip-chip has been under-filled.

The flip-chip 36 is attached to the top surface of the substrate 10 using solder bumps 38, as depicted in FIG. 4. The flip-chip 36 is preferably under-filled with a non-conductive material 40, such as an epoxy, as is depicted in FIG. 5. The under-fill material 40 is useful as both a heat-sink material, and to more securely attach the flip-chip 36 to the substrate 10.

Figure 6:
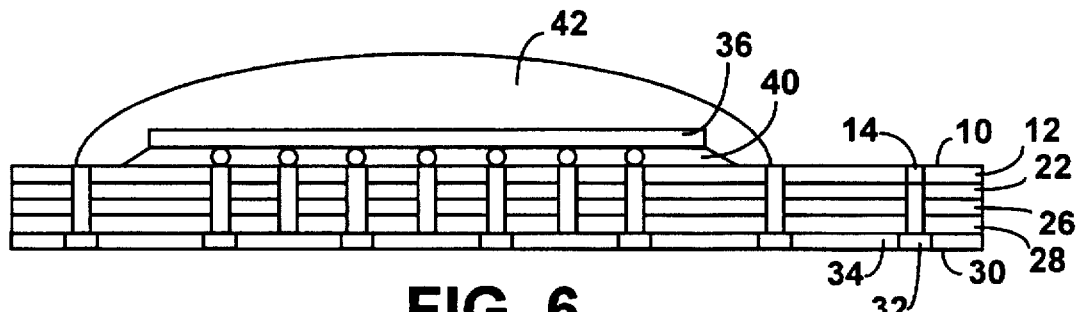
FIG. 6 is a cross-sectional view of the substrate and the flip-chip where the flip-chip has been epoxy encapsulated.
Figure 7:
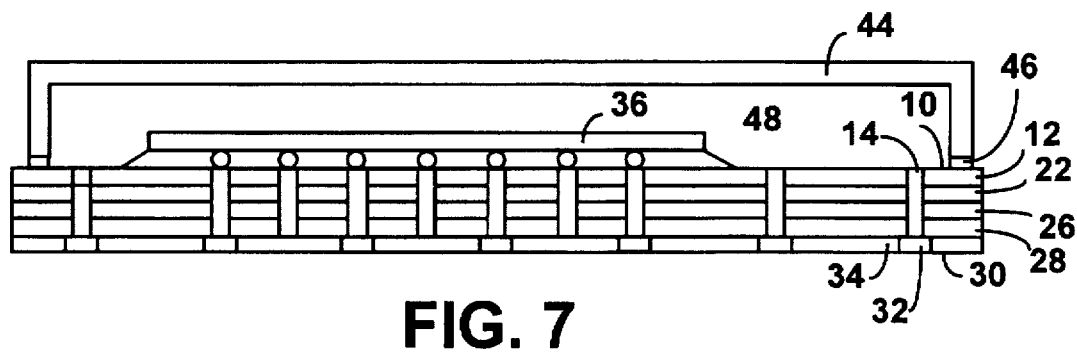
FIG. 7 is a cross-sectional view of the substrate and the flip-chip where the flip-chip has been hermetically sealed.

The flip-chip 36 is preferably encapsulated, to further protect the flip-chip from shock and abrasion. In the embodiment depicted in FIG. 6, another material, such as epoxy 42, is used to encapsulate the flip-chip 36. In the embodiment depicted in FIG. 7, a lid 44 is placed over the flip-chip 36 using means known in the art, and a hermetic seal 46 is created between the lid 44 and the substrate 10. This yields a protected region 48 around the flip-chip 36.

Figure 8:
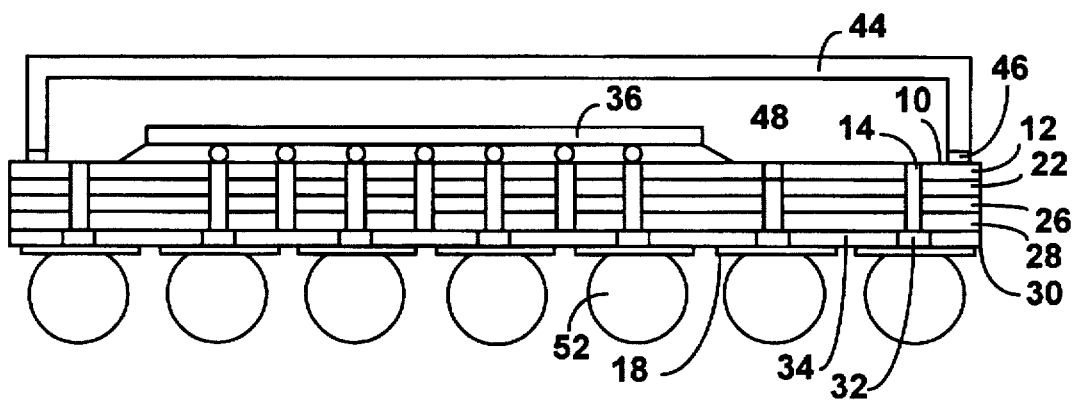
FIG. 8 is a cross-sectional view of the substrate with connectors and solder balls attached to the z-conductive layer.

After encapsulating the flip-chip 36, the connectors 18 are created on the bottom surface of the substrate 10 as depicted in FIG. 8. Solder balls 52 may be used in conjunction with the connectors 18, to provide electrical connection between the z-conductive layer 30 and the circuit board (not depicted) to which the completed package will be attached.

Figure 9:
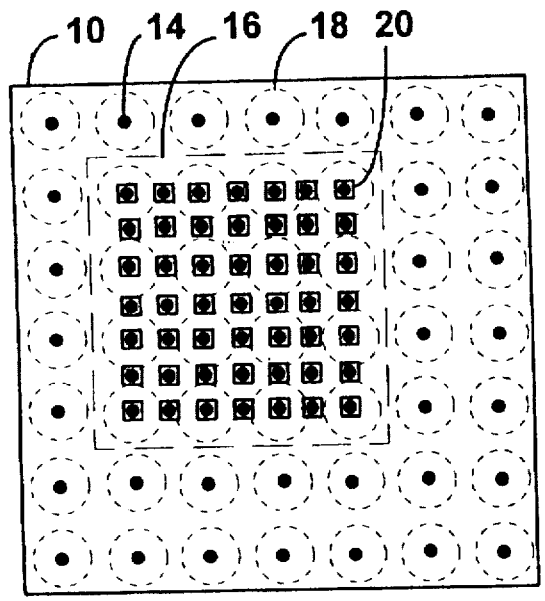
FIG. 9 is a plan view of the substrate showing solder ball positions.
Figure 10:
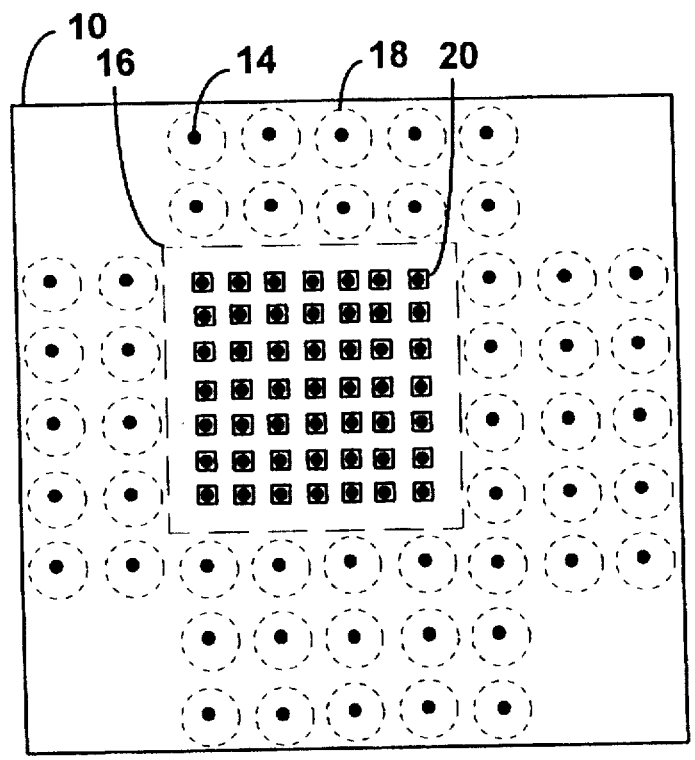
FIG. 10 is a plan view of a prior art substrate showing solder ball positions.

In FIG. 9 there is depicted a plan view of a flip-chip ball grid array package according to the present invention. As can be seen, the connectors 18 are equally spaced across the bottom surface of the substrate 10, even within the region 16 which is densely populated with through-holes. FIG. 10 depicts a prior art flip-chip ball grid array package, where connectors 18 cannot be positioned within region 16 because they would make contact to more than one through-hole 14. Thus the package of FIG. 10 requires more surface space, or in other words a large package, to accommodate the number of connectors 18 required for complete electrical connection between a flip-chip and a circuit board. As can be seen, because of the loss of the use of the space within region 16, the package depicted in FIG. 10 will of necessity always be larger than the flip-chip ball grid array package according to the present invention, as depicted in FIG. 9.

While preferred embodiments of the present invention are described above, it will be appreciated by those of ordinary skill in the art that the invention is capable of numerous modifications, rearrangements and substitutions of parts without departing from the spirit of the invention.

What is claimed is:

1. A method of mounting a flip-chip comprising:

providing a package having an insulating substrate having a substantially flat top surface and an opposing substantially flat bottom surface, and also having at least one rigid layer, disposing a plurality of electrically conductive contacts on the top surface of the substrate for receiving the flip-chip and making electrical contact thereto, extending a plurality of electrically conductive through-holes, disposed at a pitch one from the other, from the top surface of the substrate to the bottom surface of the substrate, making electrical interconnections between the contacts and the through-holes with a plurality of electrically conductive traces, attaching a z-conductive layer having a substantially flat top surface and an opposing substantially flat bottom surface to the substrate, the z-conductive layer disposed such that the top surface of the z-conductive layer is adjacent to and planar with the bottom surface of the substrate, providing electrical continuity between the bottom surface of the z-conductive layer and the through-holes, attaching a plurality of electrically conductive connectors, having a diameter that is greater than the pitch between the through-holes, to the bottom surface of the z-conductive layer, disposing the electrically conductive connectors so as to be in electrical contact through the z-conductive layer with no more than one through-hole, with at least a portion of the connectors underlying the contacts, mounting the flip-chip to the top surface of the substrate, electrically connecting the flip-chip to the electrically conductive contacts disposed on the top surface of the substrate, under-filling between the flip-chip and the top surface of the substrate, and encapsulating the flip-chip.

2. The method of claim 1 further comprising:

mounting the package to a circuit board, and electrically connecting the electrically conductive connectors attached to the bottom surface of the z-conductive layer to the circuit board.

\* \* \* \* \*